United States Patent
Hasegawa et al.

(10) Patent No.: US 7,184,293 B2
(45) Date of Patent: Feb. 27, 2007

(54) CROSSPOINT-TYPE FERROELECTRIC MEMORY

(75) Inventors: Kazumasa Hasegawa, Fujimi-machi (JP); Hiroyuki Aizawa, Shiojiri (JP)

(73) Assignee: Seiko Epson Corporation (JP)

( * ) Notice: Subject to any disclaimer, the term of this patent is extended or adjusted under 35 U.S.C. 154(b) by 164 days.

(21) Appl. No.: 10/976,241

(22) Filed: Oct. 27, 2004

(65) Prior Publication Data
US 2005/0117431 A1    Jun. 2, 2005

(30) Foreign Application Priority Data
Oct. 29, 2003    (JP)    ............... 2003-369074

(51) Int. Cl.
| | |
|---|---|
| G11C 5/06 | (2006.01) |
| G11C 5/04 | (2006.01) |
| G11C 7/02 | (2006.01) |
| G11C 11/22 | (2006.01) |
| H01L 31/119 | (2006.01) |
| H01L 29/00 | (2006.01) |
| H01L 23/552 | (2006.01) |

(52) U.S. Cl. ............... 365/145; 365/53; 365/54; 365/65; 365/130; 257/340; 257/508; 257/659

(58) Field of Classification Search .............. 365/53, 365/54, 145, 65, 130; 257/340, 508, 659
See application file for complete search history.

(56) References Cited

U.S. PATENT DOCUMENTS

| | | | |
|---|---|---|---|
| 5,313,416 A * | 5/1994 | Kimura | ............... 365/52 |
| 5,867,429 A * | 2/1999 | Chen et al. | ............ 365/185.33 |
| 6,762,950 B2 * | 7/2004 | Gudesen et al. | ............ 365/145 |
| 7,015,569 B1 * | 3/2006 | Tetelbaum | ............ 257/659 |
| 2001/0023980 A1 * | 9/2001 | Ohmori | ............ 257/678 |
| 2003/0020098 A1 * | 1/2003 | Sasaki | ............ 257/210 |
| 2003/0173654 A1 * | 9/2003 | Rodgers et al. | ............ 257/659 |
| 2004/0032010 A1 * | 2/2004 | Kools et al. | ............ 257/659 |
| 2004/0080991 A1 * | 4/2004 | Sawasaki | ............ 365/200 |
| 2004/0152213 A1 * | 8/2004 | Sawasaki et al. | ............ 438/2 |
| 2004/0245547 A1 * | 12/2004 | Stipe | ............ 257/200 |
| 2005/0162883 A1 * | 7/2005 | Nejad et al. | ............ 365/63 |
| 2005/0226041 A1 * | 10/2005 | Nejad et al. | ............ 365/158 |

FOREIGN PATENT DOCUMENTS

JP    2002-197857    7/2002

* cited by examiner

Primary Examiner—Amir Zarabian
Assistant Examiner—Ly Duy Pham
(74) Attorney, Agent, or Firm—Harness, Dickey & Pierce, P.L.C.

(57) ABSTRACT

A crosspoint-type ferroelectric memory is provided. In the crosspoint-type ferroelectric memory, a first memory cell array and a second memory cell array are stacked with a first interlayer insulating layer and a second interlayer insulating layer therebetween. The first memory cell array includes lower electrodes formed in stripes, upper electrodes formed in stripes in a direction that crosses the lower electrodes, ferroelectric capacitors that are disposed at least at intersecting parts of the lower electrodes and the upper electrodes, and an embedded insulating layer formed between the ferroelectric capacitors. The interlayer insulating layer includes a conductive layer between a first insulating layer and a second insulating layer.

7 Claims, 9 Drawing Sheets

22a WIRING PART

A — A

22a WIRING PART
26 SECOND INSULATING LAYER
20 INTERLAYER INSULATING LAYER
22 CONDUCTIVE LAYER
24 FIRST INSULATING LAYER 38
40
34 FERROELECTRIC CAPACITOR
36

CROSSPOINT-TYPE FERROELECTRIC MEMORY

RELATED APPLICATIONS

This application claims priority to Japanese Patent Application No. 2003-369074 filed Oct. 29, 2003 which is hereby expressly incorporated by reference herein in its entirety.

BACKGROUND

1. Field of the Invention

The present invention relates to memory cell arrays including ferroelectric capacitors, and in particular to a passive-matrix crosspoint-type ferroelectric memory that does not include cell transistors and only uses ferroelectric capacitors.

2. Description of the Related Art

A passive-matrix memory cell array that does not include cell transistors and only uses ferroelectric capacitors has an extremely simple construction and can be produced with a high degree of integration, and therefore there is great expectation for such devices. In recent years, research and development into even higher integration has been progressing and as one example, a technique for increasing integration has been realized by stacking memory cell arrays, which are composed of ferroelectric capacitors, in a plurality of layers (see Japanese Unexamined Patent Publication No. 2002-197857 (pages 11 to 22 and FIG. 2).

To keep the adjacent memory cell arrays electrically insulated from each other when memory cell arrays composed of ferroelectric capacitors are stacked in a plurality of layers to achieve high-density integration, it is necessary to form the memory cell arrays with an interlayer insulating layer in between.

In this state, if, for example, the memory cell arrays above and below are simultaneously operated, noise will be mutually generated by the memory cell arrays that are adjacent via the interlayer insulating layer therebetween. There has also been the problem that when one of the memory cell arrays is operated, the data stored by the other memory cell array is adversely affected.

It is an object of the present invention to provide, for a crosspoint-type ferroelectric memory in which a plurality of memory cell arrays respectively composed of ferroelectric capacitors that are stacked in layers, a high-quality crosspoint-type ferroelectric memory in which memory cell arrays disposed on respective layers with interlayer insulating layers therebetween are protected against noise received from adjacent memory cell arrays.

SUMMARY

A cross point type ferroelectric memory is provided comprising a plurality of memory cell arrays which are stacked with interlayer insulating layers therebetween, each memory cell array including:
lower electrodes formed in stripes;
upper electrodes formed in stripes in a direction that crosses the lower electrodes;
ferroelectric capacitors respectively including a part of one of the lower electrodes, a part of one of the upper electrodes, and a ferroelectric part disposed at least at a crossing part of the one of the lower electrodes and the one of the upper electrodes; and
an embedded insulating layer formed between the ferroelectric capacitors,
wherein each interlayer insulating layer includes a conductive layer between a first insulating layer and a second insulating layer.

With the crosspoint-type ferroelectric memory according to the present invention, operation noise generated by the memory cell arrays adjacent to the interlayer insulating layer is shut out by the conductive layer of the interlayer insulating layer, so that a high-quality crosspoint-type ferroelectric memory that does not malfunction can be provided.

As representative modifications, the memory cell arrays of the present invention may have any of the following aspects.

In each interlayer insulating layer, the first insulating layer, the conductive layer and the second insulating layer may have substantially a same exterior shape, and may be formed so as to substantially match a formation region of the memory cell array that is adjacently arranged above the interlayer insulating layer. By doing so, the respective memory cell array stacked with interlayer insulating layers therebetween can be prevented from the effects of noise received from adjacent memory cell arrays, peripheral circuits, and the like.

The first insulating layer and the second insulating layer of each interlayer insulating layer may be connected to one another in at least one part of a formation region of the interlayer insulating layer. By doing so, a larger connecting area can be achieved for the first insulating layer and the second insulating layer, so that the first insulating layer and the second insulating layer can be attached more tightly.

The conductive layer of each interlayer insulating layer may be composed of an oxide conductive material. By doing so, attachment of the conductive layer to the first insulating layer and the second insulating layer can be made more reliable.

The conductive layer of each interlayer insulating layer may be composed of a conductive material that transmits light. By doing so, it is possible to crystallize the ferroelectric parts using light energy.

The conductive layer of each interlayer insulating layer may be set to a predetermined potential. By doing so, it is possible to shield out noise.

The potential may be a ground level of a peripheral circuit. By doing so, it is possible to efficiently shield out noise.

The ferroelectric capacitors may be crystallized by irradiation with light after the interlayer insulating layers have been formed. By doing so, it is possible to crystallize the ferroelectric capacitors all together after a plurality of memory cell arrays have been formed.

DETAILED DESCRIPTION

Embodiments of the present invention will now be described with reference to the accompanying drawings.

First Embodiment

Figure 1:
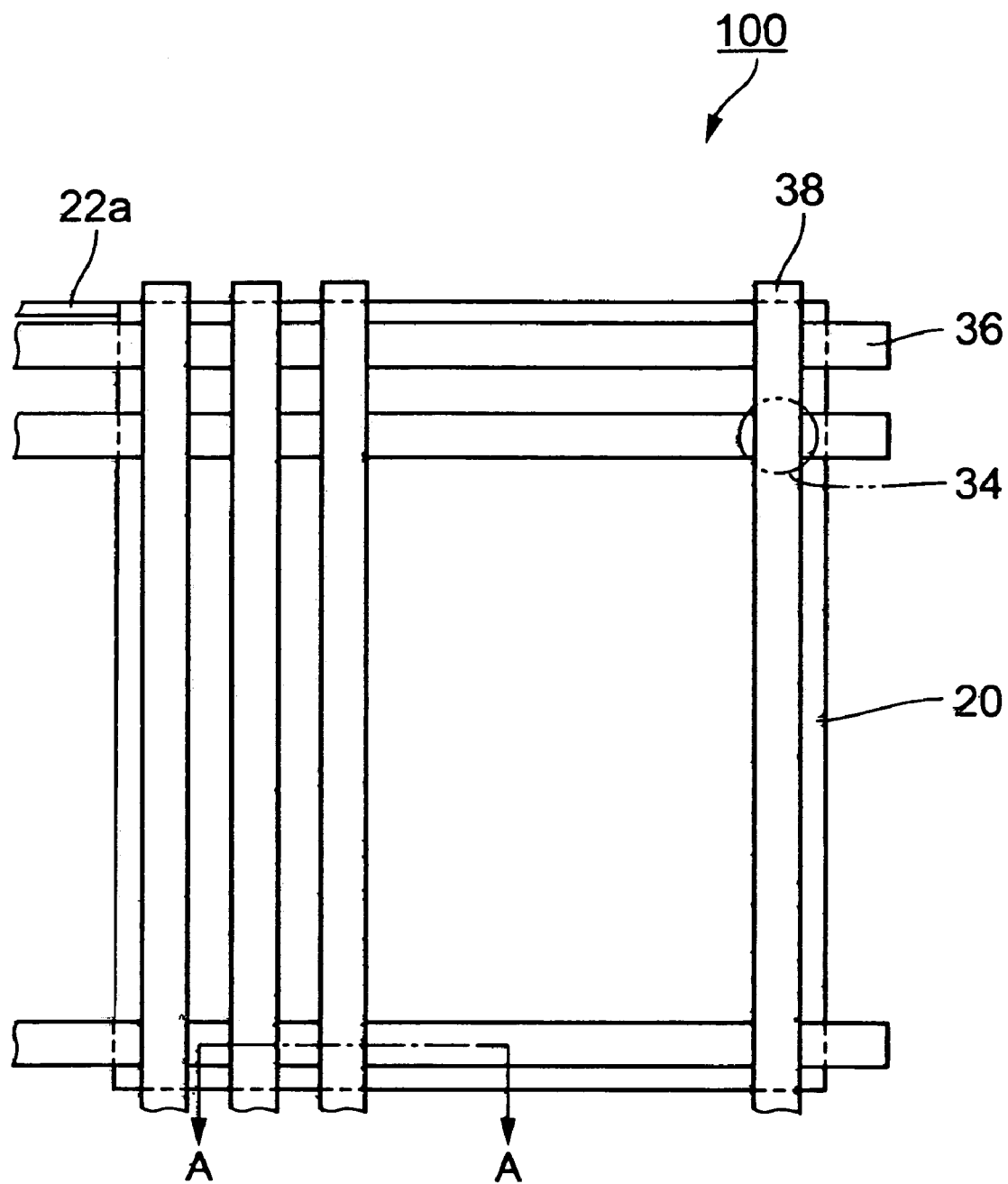
FIG. 1 is a plan view schematically showing a crosspoint-type ferroelectric memory according to a first embodiment.
Figure 2:
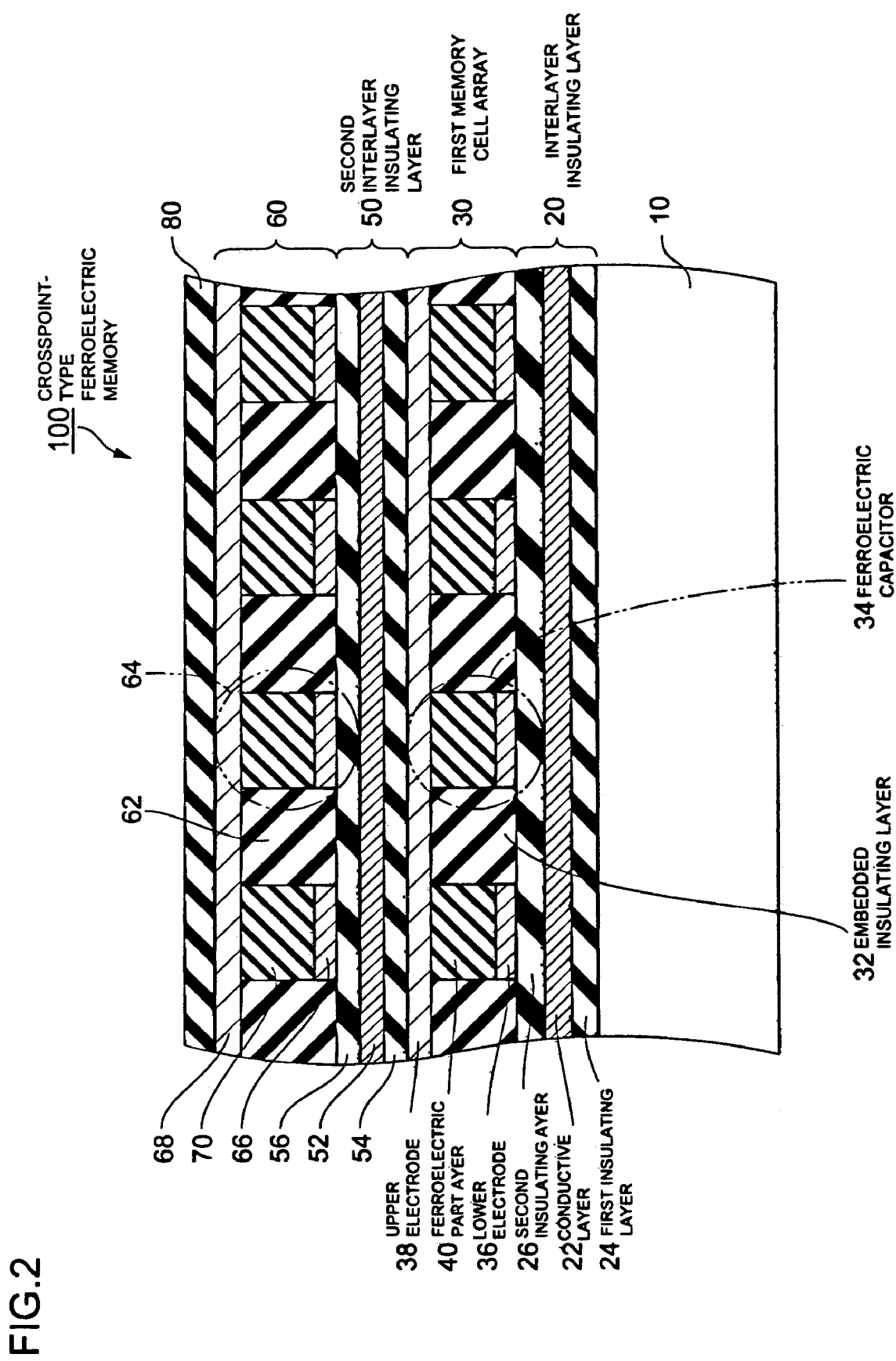
FIG. 2 is a cross-sectional view schematically showing part of the crosspoint-type ferroelectric memory along the line A—A in FIG. 1.
Figure 3A:
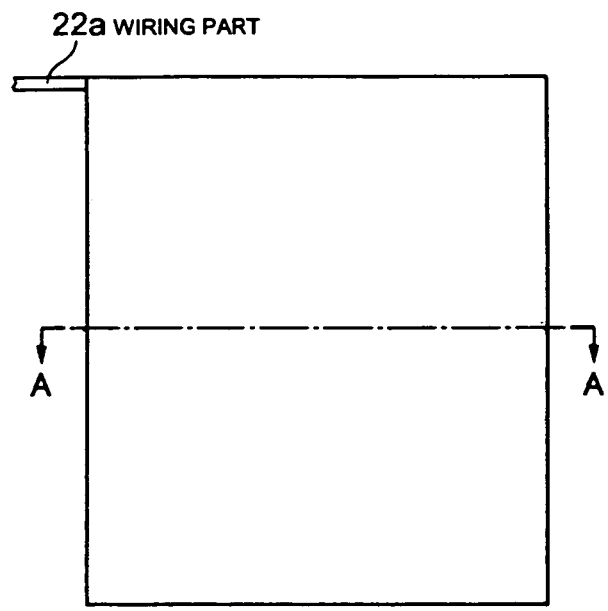
FIG. 3A is a plan view of an interlayer insulating layer of the crosspoint-type ferroelectric memory according to the first embodiment.
Figure 3B:
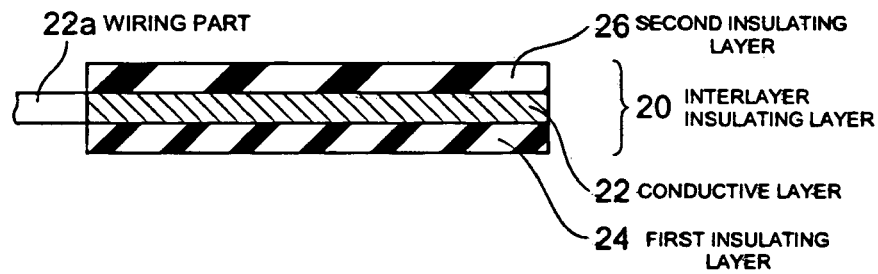
FIG. 3B is a cross-sectional view schematically showing a cross-section along the line A—A in FIG. 3A.
Figure 4:
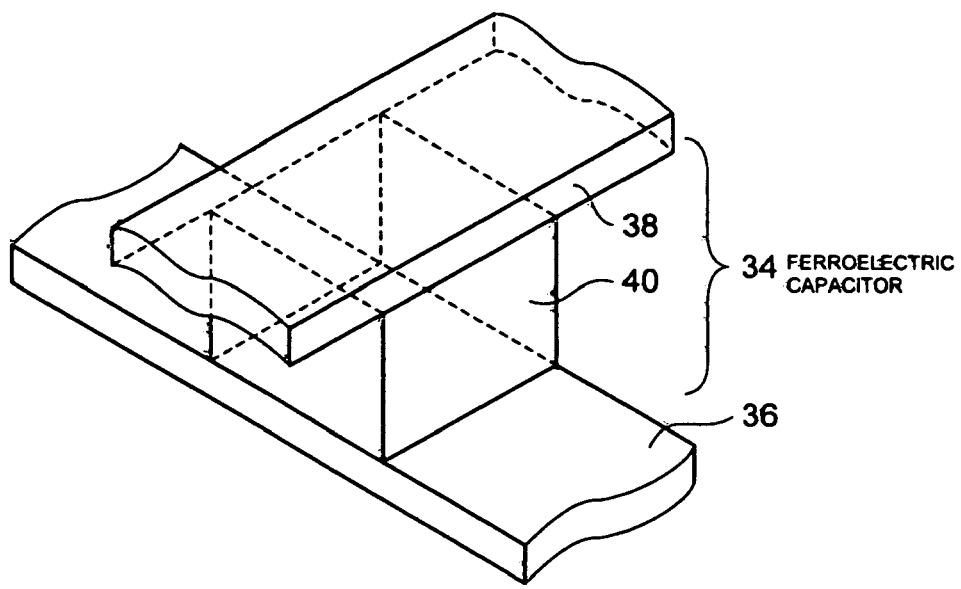
FIG. 4 is a perspective view schematically showing a ferroelectric capacitor.

FIG. 1 is a plan view schematically showing a crosspoint-type ferroelectric memory according to a first embodiment, and FIG. 2 is a cross-sectional view schematically showing one part of the crosspoint-type ferroelectric memory along the line A—A in FIG. 1. FIG. 3A is a plan view schematically showing an interlayer insulating layer of the crosspoint-type ferroelectric memory according to the first embodiment, and FIG. 3B is a cross-sectional view schematically showing a cross section along a line A—A of the FIG. 3A. FIG. 4 is a perspective view schematically showing a ferroelectric capacitor.

As shown in FIG. 2, in a crosspoint-type ferroelectric memory 100 according to the present embodiment, a first interlayer insulating layer 20 is formed on a base 10 and a first memory cell array 30 is formed on the first interlayer insulating layer 20. A multilayer structure composed of the first interlayer insulating layer 20 and the first memory cell array 30 is used as a base, and a second memory cell array 60 is formed on top of the base via a second interlayer insulating layer 50. A protective layer 80 is formed on the second memory cell array 60.

Although not shown, peripheral circuits and the like including semiconductor elements such as MOS transistors are formed on a semiconductor substrate on the base 10.

The first memory cell array 30 includes lower electrodes 36 formed in stripes, upper electrodes 38 formed in stripes in a direction that crosses the lower electrodes 36, ferroelectric capacitors 34 that each include part of one lower electrode 36, part of one upper electrode 38, and a ferroelectric part disposed at an intersection of the lower and upper electrodes 36 and 38, and an embedded insulating layer 32.

That is, the ferroelectric capacitors 34 are formed at the intersecting parts in a matrix formed by the upper electrodes 38 and the lower electrodes 36. The embedded insulating layer 32 is formed in parts of the region between the first interlayer insulating layer 20 and the second interlayer insulating layer 50, which are at the top and bottom of the first memory cell array 30, where the ferroelectric capacitors 34 are not present.

As shown in FIG. 4, each ferroelectric capacitor 34 includes part of a lower electrode 36, part of an upper electrode 38, and a ferroelectric part 40. The ferroelectric parts 40 are provided between the lower electrodes 36 and the upper electrodes 38. The ferroelectric parts 40 are preferably formed in shapes that match the intersecting parts of the lower electrodes 36 and the upper electrodes 38.

The ferroelectric capacitors 34 are provided with write signals and read signals from peripheral circuits (not shown) via the lower electrodes 36 and the upper electrodes 38 and function as ferroelectric memories.

A material that includes an electrically insulating layer is used for the embedded insulating layer 32, with the embedded insulating layer 32 electrically insulating the lower electrodes 36 and the upper electrodes 38 inside the first memory cell array 30 from one another.

The first interlayer insulating layer 20 is disposed between the base 10 and the first memory cell array 30 and electrically insulates the peripheral circuits (not shown) formed on the base 10 and the lower electrodes 36 of the first memory cell array 30 from one another.

As shown in FIG. 1, the formation region of the first interlayer insulating layer 20 substantially matches the formation region of the first memory cell array 30.

As shown in FIG. 3B, the first interlayer insulating layer 20 includes a first insulating layer 24, a conductive layer 22, and a second insulating layer 26. The conductive layer 22 is provided between the first insulating layer 24 and the second insulating layer 26. The first insulating layer 24, the second insulating layer 26, and the conductive layer 22 are formed in substantially the same flat (planar) shape.

Also, as shown in FIG. 1 and FIGS. 3A and 3B, a wiring part 22a is formed from one end of the conductive layer 22 and is connected to a peripheral circuit (not shown), with the conductive layer 22 being controlled from the peripheral circuit so as to be set to a predetermined potential.

As shown in FIG. 2, the second interlayer insulating layer 50 is disposed between the first memory cell array 30 and the adjacent second memory cell array 60, so that the upper electrodes 38 of the first memory cell array 30 and the lower electrodes 66 of the second memory cell array 60 are electrically insulated from each other. Although not shown, the formation region of the second interlayer insulating layer 50 substantially matches the formation region of the second memory cell array 60.

As shown in FIG. 2, the second interlayer insulating layer 50 includes a first insulating layer 54, a conductive layer 52, and a second insulating layer 56. The conductive layer 52 is provided between the first insulating layer 54 and the second insulating layer 56. Although not shown, the first insulating layer 54, the second insulating layer 56, and the conductive layer 52 have substantially the same flat shape in the same way as was described for the first interlayer insulating layer 20.

Although not shown, a wiring part 52a is formed from one end of the conductive layer 52 and is connected to a peripheral circuit (not shown), with the conductive layer 52 being controlled from the peripheral circuit so as to be set to a predetermined potential in the same way as was described for the first interlayer insulating layer 20.

The second memory cell array 60 has the same construction as the first memory cell array 30, and is formed on the second interlayer insulating layer 50. The second memory cell array 60 includes the lower electrodes 66 that are formed in stripes, upper electrodes 68 formed in stripes in a direction that crosses the lower electrodes 66, ferroelectric capacitors 64 that each include part of one lower electrode 66, part of one upper electrode 68 and a ferroelectric part disposed at an intersection of the upper and lower electrodes 66 and 68, and an embedded insulating layer 62.

That is, the ferroelectric capacitors 64 are formed at the intersecting parts in a matrix formed by the upper electrodes 68 and the lower electrodes 66. The embedded insulating layer 62 is formed in parts of a region that is between the second interlayer insulating layer 50 and the protective layer 80 where the ferroelectric capacitors 64 are not present.

Each ferroelectric capacitor 64 includes part of a lower electrode 66, part of an upper electrode 68, and a ferroelectric part 70. The ferroelectric parts 70 are provided between the lower electrodes 66 and the upper electrodes 68.

The ferroelectric capacitors 64 are provided with write signals and read signals from peripheral circuits (not shown) via the lower electrodes 66 and the upper electrodes 68 and function as ferroelectric memories.

Next, one example of a manufacturing process of the crosspoint-type ferroelectric memory 100 according to the first embodiment will be described. FIGS. 6 to 12 are cross-sectional views schematically showing the manufacturing process of the crosspoint-type ferroelectric memory 100, and are cross-sectional views that focus on only the formation regions of the first interlayer insulating layer 20 and the first memory cell array 30.

In FIG. 2, first using an LSI process, the first insulating layer 24 is formed on the base 10 using plasma TEOS or ozone TEOS according to a CVD method, for example, to electrically insulate the memory cell array region from a region where the peripheral circuits (not shown) are constructed.

Next, the conductive layer 22 is uniformly formed on the first insulating layer 24 by a method such as sputtering, vacuum deposition, or CVD. A single element conductive material, such as Ir, Pt, Ru, Cu, Ti, and Al, can be given as examples of the material of the conductive layer 22. It is possible to form the conductive layer 22 as a single layer using these single element conductive materials, or as a dual-layer conductive layer by forming a conductive layer composed of Ti, for example, and then forming a conductive layer composed of Pt, for example, on top of the Ti layer.

Also, ITO (Indium Tin Oxide: $In_2O_3$—$SnO_2$), SRO ($SrRuO_X$), LSCO ($La_XSr_{1-X}CoO_3$), YBCO ($YBa_2Cu_3O_7$), $IrO_X$, and the like can be given as examples of oxide conductive materials.

In addition, ITO (Indium Tin Oxide: $In_2O_3$—$SnO_2$), SRO ($SrRuO_X$) LSCO ($La_XSr_{1-X}CoO_3$), YBCO ($YBa_2Cu_3O_7$), IrOX, and the like can be given as examples of conductive materials with a light transmitting property.

Next, the second insulating layer 26 and the first insulating layer 24 are formed on the conductive layer 22 using the same method. By carrying out the above manufacturing process, the first interlayer insulating layer 20 can be formed. Here, in cases where it is necessary to form the first interlayer insulating layer 20 only in a specified region, it is possible to achieve this by forming a resist layer on the second insulating layer 26 in a shape that corresponds to the specified region and then patterning the first interlayer insulating layer 20 by etching.

Figure 6:
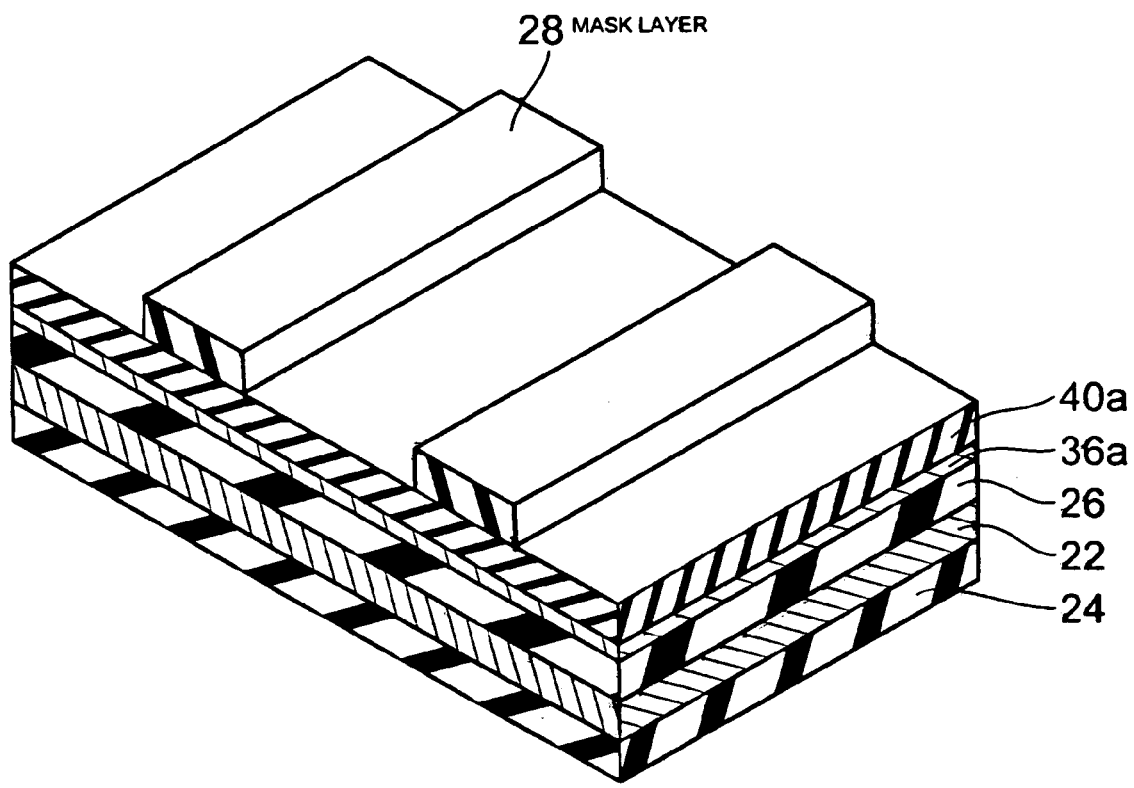
FIG. 6 is a cross-sectional view schematically showing a manufacturing process of the crosspoint-type ferroelectric memory according to the first embodiment.

Next, as shown in FIG. 6, a conductive layer 36a for the lower electrodes 36 is uniformly formed by a method such as sputtering, vacuum deposition, and CVD. Ir, $IrO_X$, Pt, $RuO_X$, $SrRuOx$, and $LaSrCoO_X$ can be given as examples of the material of the conductive layer 36a. It should be noted that the base 10 is not shown in FIGS. 6 to 12.

Next, a ferroelectric layer 40a for the ferroelectric parts 40 is uniformly formed on the conductive layer 36a using a method such as spin coating or dipping using a sol-gel material or a MOD material, sputtering, MOCVD, and laser abrasion. So long as the material exhibits ferroelectric characteristics and can be used as a capacitor insulating layer, it is possible to use any composition as the material of the ferroelectric layer 40a. Here, PZT ($PbZrzTi_{1-Z}O_3$) and SBT ($SrBi_2Ta_2O_9$) can be given as examples of ferroelectric materials.

Next, a mask layer 28 is formed on the entire surface of the ferroelectric layer 40a, and by carrying out lithography and etching, the mask layer 28 is patterned into a predetermined pattern. That is, the mask layer 28 is formed on regions in which the lower electrodes 36 will be formed.

Figure 7:
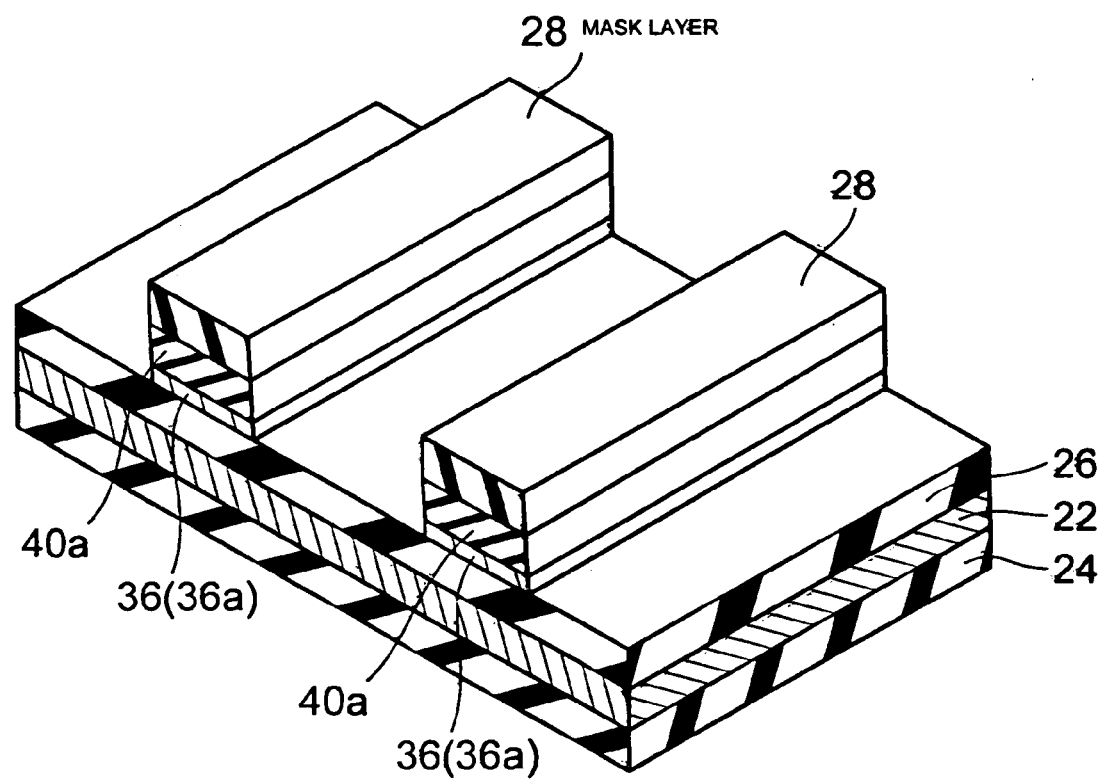
FIG. 7 is a cross-sectional view schematically showing the manufacturing process of the crosspoint-type ferroelectric memory according to the first embodiment.

Next, as shown in FIG. 7, the ferroelectric layer 40a and the conductive layer 36a are patterned using the patterned mask layer 28 as a mask. A high-density plasma etching method such as RIE, ion milling, and ICP (Inductively Coupled Plasma) can be given as examples of the etching method.

Figure 8:
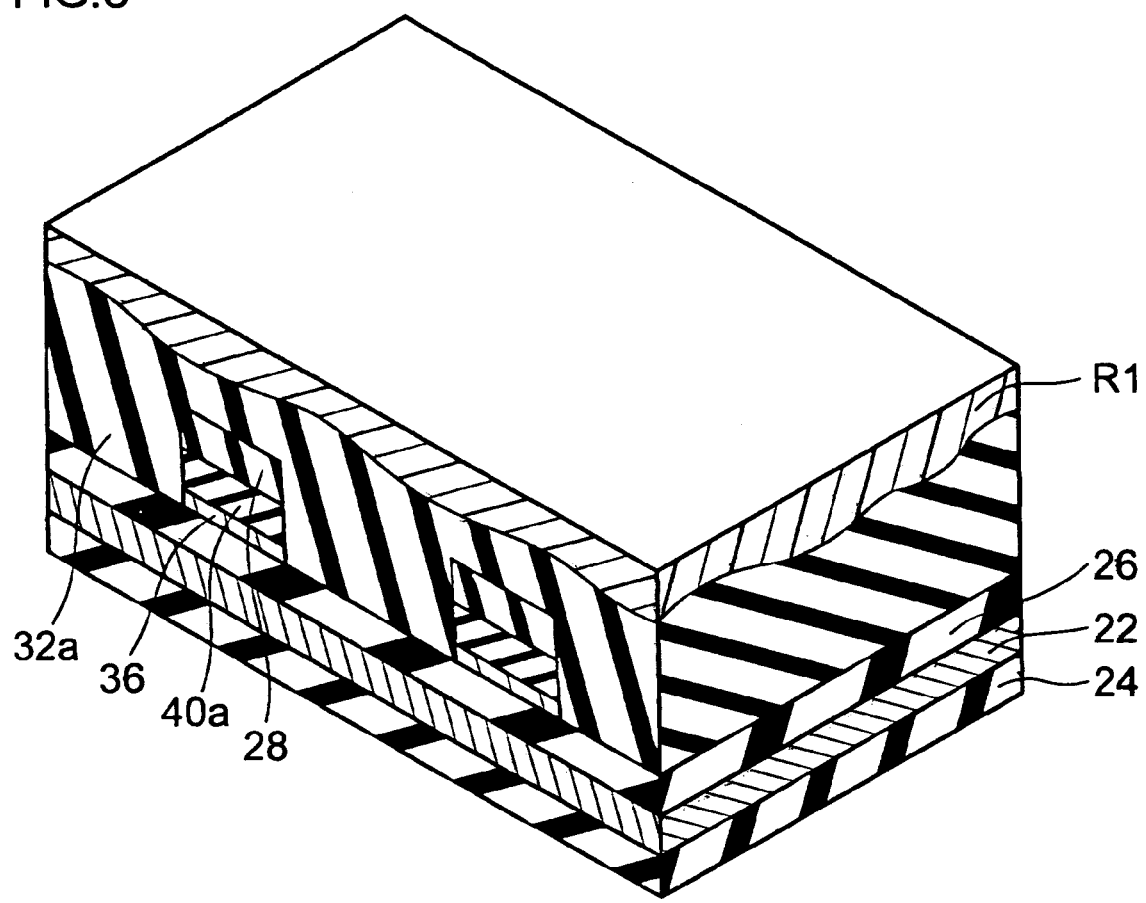
FIG. 8 is a cross-sectional view schematically showing the manufacturing process of the crosspoint-type ferroelectric memory according to the first embodiment.

Next, as shown in FIG. 8, an embedded insulating layer 32a is formed on the entire surface. The material of the embedded insulating layer 32a is silicon oxide or aluminum oxide, for example. CVD can be given as an example of the method of forming the embedded insulating layer 32a. The embedded insulating layer 32a is formed so as to fill respective gaps between the multilayer structures composed of the lower electrodes 36, the ferroelectric layer 40a, and the mask layer 28.

Next, as necessary, a resist layer R1 is formed on the embedded insulating layer 32a. The resist layer R1 is formed so that an upper surface thereof is flat.

Figure 9:
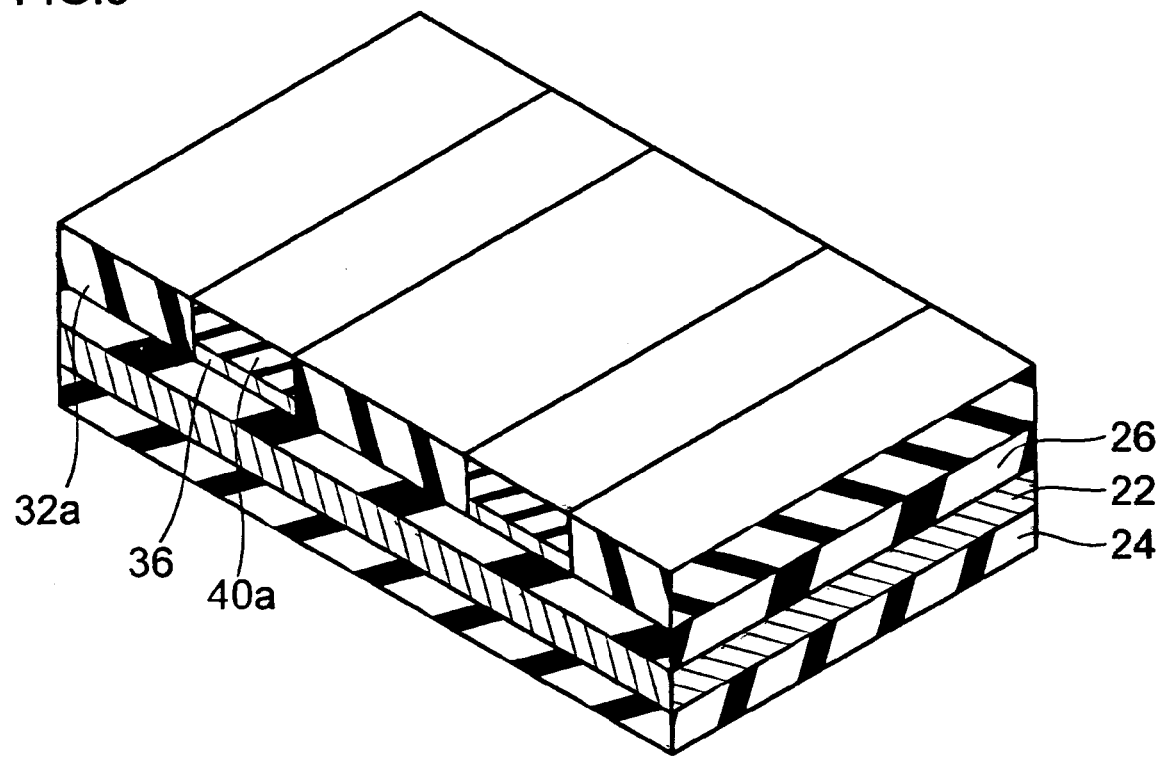
FIG. 9 is a cross-sectional view schematically showing the manufacturing process of the crosspoint-type ferroelectric memory according to the first embodiment.

Next, as shown in FIG. 9, the embedded insulating layer 32a and the resist layer R1 are etched back. At the same time as this etching back, the mask layer 28 is removed to expose the surfaces of the ferroelectric layer 40a. Here, a conventional method can be used as the etch back method. During this etching, the embedded insulating layer 32a is formed so as to cover side surfaces of the lower electrodes 36 and of the ferroelectric layer 40a.

Next, a conductive layer 38a is formed on the entire surface. The material and formation method of the conductive layer 38a can be the same as the material and formation method of the lower electrodes 36.

Figure 10:
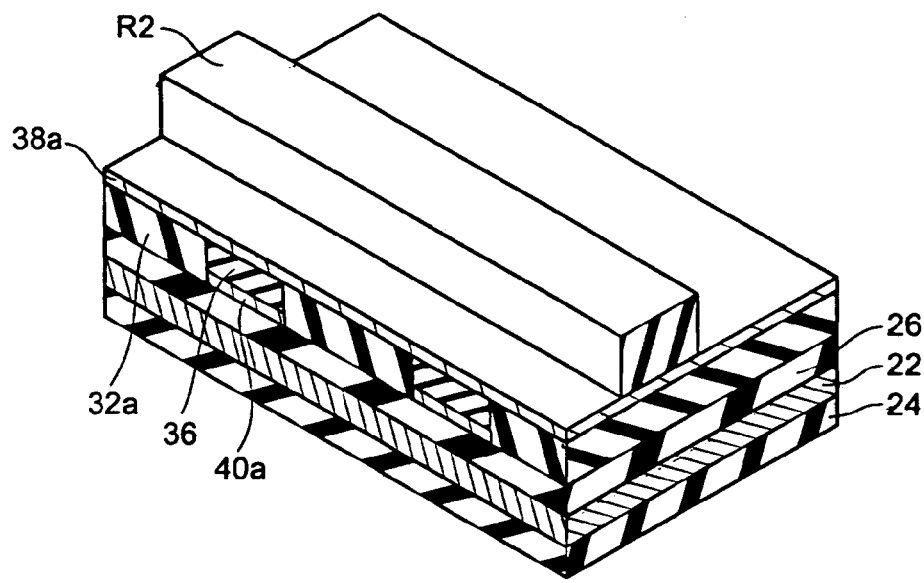
FIG. 10 is a cross-sectional view schematically showing the manufacturing process of the crosspoint-type ferroelectric memory according to the first embodiment.

Next, as shown in FIG. 10, the resist layer R2 with a predetermined pattern is formed on the conductive layer 38a. The resist layer R2 is formed in a region in which the upper electrodes 38 will be formed.

Figure 11:
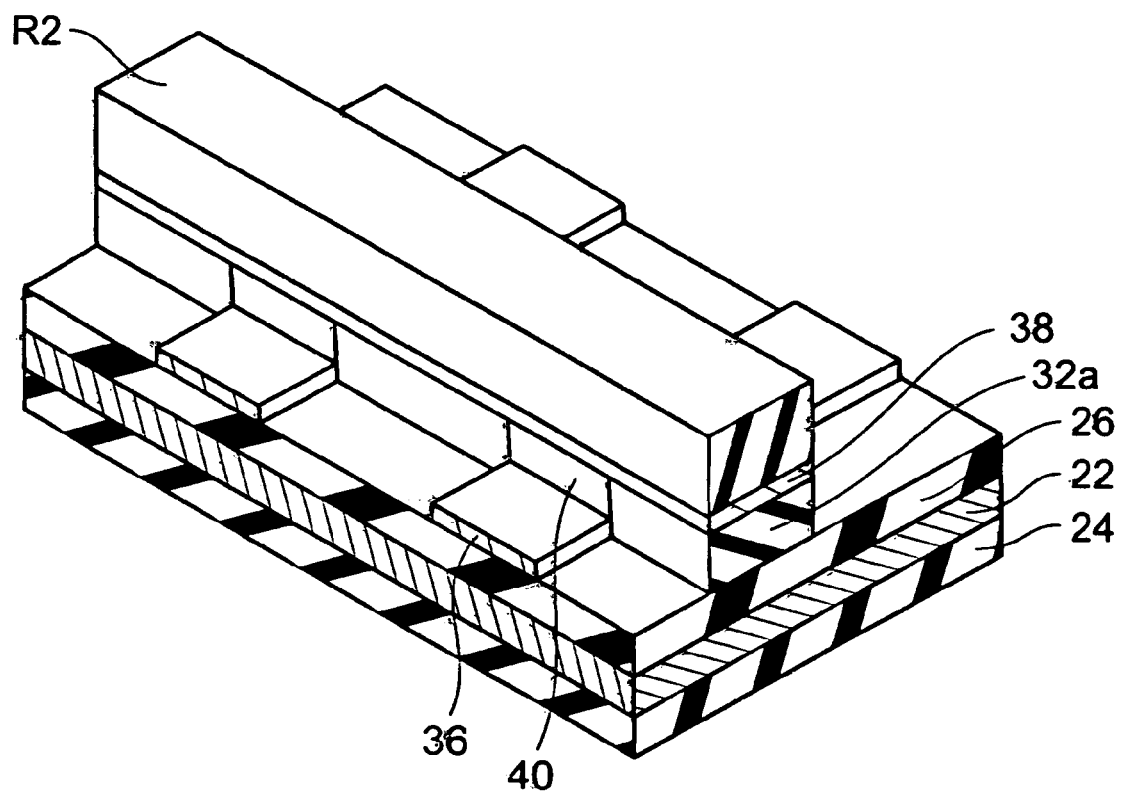
FIG. 11 is a cross-sectional view schematically showing the manufacturing process of the crosspoint-type ferroelectric memory according to the first embodiment.

Next, as shown in FIG. 11, the conductive layer 38a, the ferroelectric layer 40a, and the embedded insulating layer 32a are etched with the resist layer R2 as a mask. By patterning the conductive layer 38a and the ferroelectric layer 40a in this way, the ferroelectric capacitor 34 are formed at the intersecting regions of the lower electrodes 36 and the upper electrodes 38.

Figure 12:
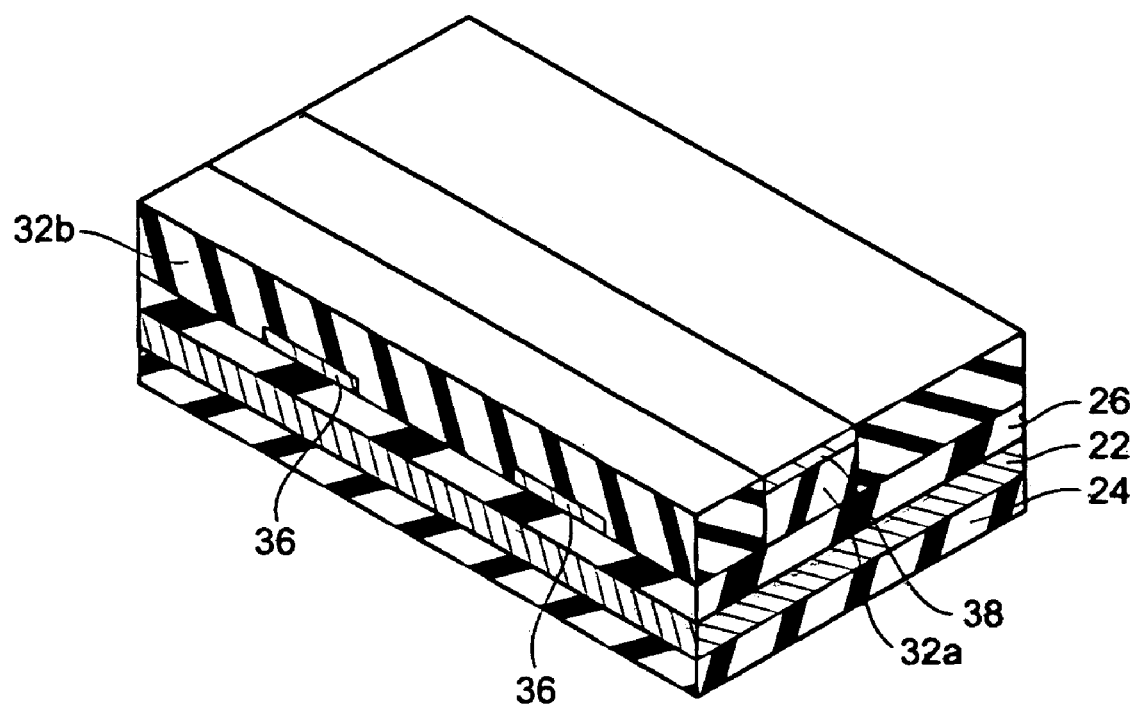
FIG. 12 is a cross-sectional view schematically showing the manufacturing process of the crosspoint-type ferroelectric memory according to the first embodiment.

Next, as shown in FIG. 12, an embedded insulating layer 32b is formed so as to be substantially flush with an upper surface of the upper electrodes 38. The embedded insulating layer 32b can be formed using the same method as the embedded insulating layer 32a shown in FIGS. 8 and 9. As a result, the upper surfaces of the embedded insulating layer 32b and upper electrodes 38 form a substantially flat surface. The process thus far forms the first memory cell array 30 on the first interlayer insulating layer 20.

Next, the second interlayer insulating layer 50 is formed on the first memory cell array 30. The second interlayer insulating layer 50 can be formed using the same method as the first interlayer insulating layer 20, for example.

Next, the second memory cell array 60 is formed on the second interlayer insulating layer 50. The second memory cell array 60 can be formed using the same method as the first memory cell array 30, for example.

Next, to achieve favorable characteristics, laser light or lamp light, for example, is irradiated from above the second memory cell array 60 to crystallize the ferroelectric parts 40 of the ferroelectric capacitors 34 and the ferroelectric parts 70 of the ferroelectric capacitors 64 that are formed at the crosspoints inside the first memory cell array 30 and the second memory cell array 60. At this time, the energy of the irradiated light can be set to a suitable energy for crystallizing the ferroelectric material used for the ferroelectric parts 40 and the ferroelectric parts 70.

Finally, the protective layer 80 is formed on the second memory cell array 60, thereby completing the crosspoint-type ferroelectric memory 100.

Next, the operation and effects of the crosspoint-type ferroelectric memory 100 according to the present embodiment will be described.

The first interlayer insulating layer 20 has the conductive layer 22 between the first insulating layer 24 and the second insulating layer 26. This means that electrical noise generated between the peripheral circuits and the like (not shown) formed on the base 10 and the lower electrodes 36 of the first memory cell array 30 is shut out (blocked) by the conductive layer 22, so that such noise does not affect the operation of the peripheral circuits and the like or the operation of the ferroelectric capacitors 34 disposed in the first memory cell array 30.

The second interlayer insulating layer 50 includes the conductive layer 52 between the first insulating layer 54 and the second insulating layer 56. For this reason, electrical noise generated between the upper electrodes 38 of the first memory cell array 30 and the lower electrodes 66 of the second memory cell array 60 is shut out by the conductive layer 52, so that such noise does not affect the operation of the ferroelectric capacitors 34 disposed in the first memory cell array 30 and the ferroelectric capacitors 64 disposed in the first memory cell array 60. Accordingly, the stacked ferroelectric capacitors 34 and 64 operate independently without electrically interfering with one another, so that a high-quality crosspoint-type ferroelectric memory 100 can be provided.

The conductive layers 22 and 52 can be composed of oxide conductive materials. By doing so, the affinity between the materials of the first and second insulating layers 24/26 with the conductive layer 22 is increased and such layers can be reliably attached to one another. The same also applies to the first and second insulating layers 54/56 with the conductive layer 52.

In addition, the conductive layers 22 and 52 can be composed of light transmitting conductive materials. By doing so, it becomes possible to crystallize the ferroelectric parts 40 disposed in the first memory cell array 30 and the ferroelectric parts 70 disposed in the second memory cell array 60 in a single operation after the second memory cell array 60 has been formed. The manufacturing process of a stacked crosspoint-type ferroelectric memory is therefore simplified.

Second Embodiment

Figure 5A:
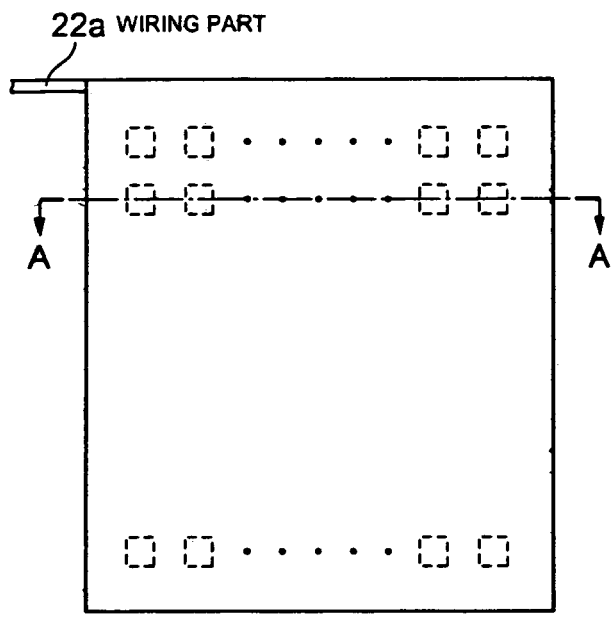
FIG. 5A is a plan view schematically showing an interlayer insulating layer of a crosspoint-type ferroelectric memory according to a second embodiment.
Figure 5B:
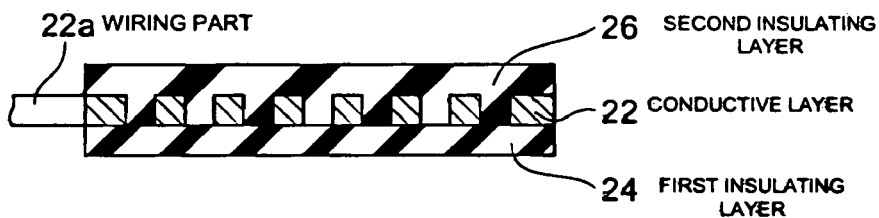
FIG. 5B is a cross-sectional view schematically showing a cross-section along the line A—A in FIG. 5A.

FIG. 5A is a plan view schematically showing an interlayer insulating layer of a crosspoint-type ferroelectric memory according to a second embodiment, and FIG. 5B is a cross-sectional view schematically showing a cross section along the line A—A in FIG. 5A. The elements that are effectively the same as in the first embodiment are designated by the same reference numerals and a detailed description thereof is omitted.

As shown by FIGS. 5A and 5B, the second embodiment differs from the first embodiment in that the first insulating layer 24 and the second insulating layer 26 have connected parts in parts.

In the present embodiment, the first insulating layer 24 and the second insulating layer 26 have parts that are connected to one another in parts of the interlayer insulating layer 20. The external form and formation region of the interlayer insulating layer 20 is the same of that of the first interlayer insulating layer (20) described in the first embodiment.

In the present embodiment, the conductive layer 22 is formed so as to substantially match the formation regions of the lower electrodes 36, which are formed in stripes, and the upper electrodes 38, which are formed in stripes in a direction that crosses to the lower electrodes 36, of the first memory cell array 30. Out of the formation region of the interlayer insulating layer 20, the first insulating layer 24 and the second insulating layer 26 are formed so as to be connected to one another in the parts where the conductive layer 22 is not formed.

According to the present embodiment, the first insulating layer 24 and the second insulating layer 26 have parts that are connected to one another. Accordingly, by forming the first insulating layer 24 and the second insulating layer 26 so that materials with high affinity are connected, the insulating layers 24 and 26 are strongly attached to one another.

By replacing parts of the conductive layer 22 with the first insulating layer 24 or the second insulating layer 26, the internal stress generated when forming the conductive layer 22 is alleviated, so that a high-quality crosspoint-type ferroelectric memory 100 can be provided.

The formation region of the conductive layer 22 is formed so as to substantially match the lower electrodes 36 and the upper electrodes 38, so that the noise shutting-out (blocking) function is in no way affected.

Next, a manufacturing process of the second embodiment will be described.

The second embodiment differs to the first embodiment in that parts where the first insulating layer 24 and the second insulating layer 26 are directly connected to one another are included in parts of the interlayer insulating layer 20. Accordingly, in the manufacturing process, only the process of forming the interlayer insulating layer 20 differs to the first embodiment, and only this part will be described.

In FIGS. 5A and 5B, first using an LSI process, the first insulating layer 24 is formed on the base 10 using plasma TEOS or ozone TEOS according to a CVD method, for example, to electrically insulate the memory cell array region from a region where the peripheral circuits (not shown) are constructed.

Next, a mask layer is formed on an entire surface of the first insulating layer 24 and by carrying out lithography and etching, the mask layer is patterned into a predetermined pattern. That is, the mask layer is patterned so as to match the regions where the lower electrodes 36 and the upper electrodes 38 are not formed.

Next, the conductive layer 22 is formed on the first insulating layer 24 by a method such as sputtering, vacuum deposition, or CVD. The material of the conductive layer 22 is the same as that described in the first embodiment.

Next, the mask layer is removed. The second insulating layer 26 is then formed on the conductive layer 22 using the same method as the first insulating layer 24. At this time, the second insulating layer 26 is formed so as to fill gaps (apertures or perforations) in the conductive layer 22, and so in some locations, parts of the second insulating layer 26 become directly connected to the first insulating layer 24.

In the embodiments of the present invention, a construction including two interlayer insulating layers and two memory cell arrays has been described, but it should be understood that the concept of the present invention can also be applied to a construction with three or more layers and arrays.

The present invention is not limited to the embodiments described above and can be subjected to various modifications without departing from the scope of the present invention.

What is claimed is:

1. A crosspoint type ferroelectric memory comprising:
a plurality of memory cell arrays which are stacked with interlayer insulating layers therebetween;
each memory cell array including:
lower electrodes formed in stripes;
upper electrodes formed in stripes in a direction that crosses the lower electrodes;
ferroelectric capacitors respectively including a part of one of the lower electrodes, a part of one of the upper electrodes, and a ferroelectric part disposed at least at a crossing part of the one of the lower electrodes and the one of the upper electrodes; and
an embedded insulating layer formed between the ferroelectric capacitors,
wherein each interlayer insulating layer includes a conductive layer between a first insulating layer and a second insulating layer, and
wherein the first insulating layer and the second insulating layer of each interlayer insulating layer are directly connected to one another in at least one part of a formation region of the interlayer insulating layer.

2. The crosspoint-type ferroelectric memory according to claim 1, wherein in each interlayer insulating layer, the first insulating layer, the conductive layer and the second insulating layer have substantially a same exterior shape, and substantially match a formation region of the memory cell array that is arranged adjacently above the interlayer insulating layer.

3. The crosspoint-type ferroelectric memory according to claim 1, wherein the conductive layer of each interlayer insulating layer comprises an oxide conductive material.

4. The crosspoint-type ferroelectric memory according to claim 1, wherein the conductive layer of each interlayer insulating layer comprises a conductive material that transmits light.

5. The crosspoint-type ferroelectric memory according to claim 1, wherein the conductive layer of each interlayer insulating layer is set to a predetermined potential.

6. The crosspoint-type ferroelectric memory according to claim 5, wherein the predetermined potential comprises a ground level of a peripheral circuit.

7. The crosspoint-type ferroelectric memory according to claim 4, wherein the ferroelectric capacitors are crystallized by irradiation with light after the interlayer insulating layers have been formed.

* * * * *

UNITED STATES PATENT AND TRADEMARK OFFICE
CERTIFICATE OF CORRECTION

PATENT NO. : 7,184,293 B2  
APPLICATION NO. : 10/976241  
DATED : February 27, 2007  
INVENTOR(S) : Kazumasa Hasegawa It is certified that error appears in the above-identified patent and that said Letters Patent is hereby corrected as shown below:

On Title Page Item (56), References Cited, US Patent Docs:
    Add -- 2003/0197178 A1   4/2005 Nejad et al.   365/63 --

Column 5, Line 52:    "IrOX" should be -- $IrO_x$ --.

Column 5, Line 67:    "SrRuOx" should be -- $SrRuO_x$ --.

Signed and Sealed this

Tenth Day of July, 2007

JON W. DUDAS  
*Director of the United States Patent and Trademark Office*